(12) United States Patent
Damborsky et al.

(10) Patent No.: US 11,552,229 B2
(45) Date of Patent: Jan. 10, 2023

(54) SPACER LAYER ARRANGEMENTS FOR LIGHT-EMITTING DIODES

(71) Applicant: CreeLED, Inc., Durham, NC (US)

(72) Inventors: Kyle Damborsky, Apex, NC (US);
Ayush Tripathi, Raleigh, NC (US);
Robert Wilcox, Rolesville, NC (US);
Sarah Trinkle, Morrisville, NC (US);
Colin Blakely, Raleigh, NC (US)

(73) Assignee: CreeLED, Inc., Durham, NC (US)

( * ) Notice: Subject to any disclaimer, the term of this patent is extended or adjusted under 35 U.S.C. 154(b) by 94 days.

(21) Appl. No.: 17/019,593

(22) Filed: Sep. 14, 2020

(65) Prior Publication Data

US 2022/0085258 A1    Mar. 17, 2022

(51) Int. Cl.
| | |
|---|---|
| *H01L 33/58* | (2010.01) |
| *H01L 33/52* | (2010.01) |
| *H01L 25/075* | (2006.01) |
| *H01L 33/00* | (2010.01) |

(52) U.S. Cl.
CPC .......... *H01L 33/58* (2013.01); *H01L 25/0753* (2013.01); *H01L 33/005* (2013.01); *H01L 33/52* (2013.01); *H01L 2933/0083* (2013.01)

(58) Field of Classification Search
CPC ..... H01L 33/58; H01L 25/0753; H01L 33/52; H01L 2933/0083
See application file for complete search history.

(56) References Cited

U.S. PATENT DOCUMENTS

| | | |
|---|---|---|
| 8,564,000 B2 | 10/2013 | Hussell et al. |
| 8,669,573 B2 | 3/2014 | Medendorp, Jr. |
| 8,866,169 B2 | 10/2014 | Emerson et al. |

(Continued)

FOREIGN PATENT DOCUMENTS

| | | |
|---|---|---|
| WO | 2015101899 A1 | 7/2015 |
| WO | 2016022707 A1 | 2/2016 |

OTHER PUBLICATIONS

Final Office Action for U.S. Appl. No. 17/016,701, dated Dec. 21, 2021, 13 pages.

(Continued)

*Primary Examiner* — Jay C Chang
*Assistant Examiner* — Mikka Liu
(74) *Attorney, Agent, or Firm* — Withrow & Terranova, P.L.L.C.

(57) ABSTRACT

Solid-state lighting devices including light-emitting diodes (LEDs), and more particularly LEDs and packaged LED devices with spacer layer arrangements are disclosed. An LED package may include one or more LED chips on a submount with a light-altering material arranged to redirect light in a desired emission direction with increased efficiency. A spacer layer is arranged in the LED package to cover rough surfaces and any gaps that may be formed between adjacent LED chips. When the light-altering material is applied to the LED package, the spacer layer provides a surface that reduces unintended propagation of the light-altering material toward areas of the LED package that would interfere with desired light emissions, for example over LED chips and between LED chips. In various arrangements, the spacer layer may cover one or more surfaces of a lumiphoric material, one or more LED chip surfaces, and portions of an underlying submount.

22 Claims, 10 Drawing Sheets

(56) References Cited

U.S. PATENT DOCUMENTS

| | | |
|---|---|---|
| 9,070,850 B2 | 6/2015 | Keller et al. |
| 9,887,327 B2 | 2/2018 | Reiherzer et al. |
| 10,516,081 B1 | 12/2019 | Xin et al. |
| 10,522,722 B2 | 12/2019 | Damborsky et al. |
| 10,811,573 B2 | 10/2020 | Damborsky et al. |
| 2006/0145172 A1 | 7/2006 | Su et al. |
| 2008/0191225 A1 | 8/2008 | Medendorp |
| 2010/0320482 A1 | 12/2010 | Tachibana |
| 2013/0322088 A1 | 12/2013 | Huang et al. |
| 2013/0334559 A1 | 12/2013 | Vdovin et al. |
| 2014/0021493 A1 | 1/2014 | Andrews et al. |
| 2014/0226317 A1 | 8/2014 | Livesay et al. |
| 2014/0291715 A1 | 10/2014 | Reiherzer et al. |
| 2015/0179903 A1 | 6/2015 | Pun et al. |
| 2015/0280081 A1 | 10/2015 | Wada |
| 2016/0093780 A1* | 3/2016 | Beppu .................. H01L 21/3213 438/27 |
| 2017/0069606 A1* | 3/2017 | Gould .................... H01L 33/505 |
| 2017/0098746 A1 | 4/2017 | Bergmann et al. |
| 2017/0294560 A1 | 10/2017 | Ho et al. |
| 2019/0326485 A1 | 10/2019 | Damborsky et al. |
| 2021/0217936 A1* | 7/2021 | Shi .......................... H01L 33/58 |

OTHER PUBLICATIONS

Examination Report for European Patent Application No. 19712473.8, dated Dec. 17, 2021, 9 pages.

Non-Final Office Action for U.S. Appl. No. 17/016,701, dated Aug. 5, 2021, 12 pages.

International Preliminary Report on Patentability for International Patent Application No. PCT/US2019/021393, dated Oct. 29, 2020, 12 pages.

Non-Final Office Action for U.S. Appl. No. 15/957,454, dated May 1, 2019, 10 pages.

Final Office Action for U.S. Appl. No. 15/957,454, dated Jul. 26, 2019, 14 pages.

Notice of Allowance for U.S. Appl. No. 15/957,454, dated Aug. 27, 2019, 8 pages.

International Search Report and Written Opinion for International Patent Application No. PCT/US2019/021393, dated May 22, 2019, 18 pages.

Non-Final Office Action for U.S. Appl. No. 16/686,457, dated Feb. 24, 2020, 6 pages.

Notice of Allowance for U.S. Appl. No. 16/686,457, dated Jun. 12, 2020, 7 pages.

Notice of Allowance for U.S. Appl. No. 17/016,701, dated Mar. 18, 2022, 7 pages.

* cited by examiner

SPACER LAYER ARRANGEMENTS FOR LIGHT-EMITTING DIODES

FIELD OF THE DISCLOSURE

The present disclosure relates to solid-state lighting devices including light-emitting diodes (LEDs), and more particularly to LEDs and packaged LED devices with spacer layer arrangements.

BACKGROUND

Solid-state lighting devices such as light-emitting diodes (LEDs) are increasingly used in both consumer and commercial applications. Advancements in LED technology have resulted in highly efficient and mechanically robust light sources with a long service life. Accordingly, modern LEDs have enabled a variety of new display applications and are being increasingly utilized for general illumination applications, often replacing incandescent and fluorescent light sources.

LEDs are solid-state devices that convert electrical energy to light and generally include one or more active layers of semiconductor material (or an active region) arranged between oppositely doped n-type and p-type layers. When a bias is applied across the doped layers, holes and electrons are injected into the one or more active layers where they recombine to generate emissions such as visible light or ultraviolet emissions. An LED chip typically includes an active region that may be fabricated, for example, from silicon carbide, gallium nitride, gallium phosphide, aluminum nitride, gallium arsenide-based materials, and/or from organic semiconductor materials. Photons generated by the active region are initiated in all directions.

Typically, it is desirable to operate LEDs at the highest light emission efficiency possible, which can be measured by the emission intensity in relation to the output power (e.g., in lumens per watt). A practical goal to enhance emission efficiency is to maximize extraction of light emitted by the active region in the direction of the desired transmission of light. Light extraction and external quantum efficiency of an LED can be limited by a number of factors, including internal reflection. According to the well-understood implications of Snell's law, photons reaching the surface (interface) between an LED surface and the surrounding environment are either refracted or internally reflected. If photons are internally reflected in a repeated manner, then such photons eventually are absorbed and never provide visible light that exits an LED.

LED packages have been developed that include a single LED chip or multiple LED chips arranged within the same package. In some multiple LED chip packages, the LED chips can be provided such that emissions corresponding to individual LED chips are combined to produce a desired light emission for the LED package. The emissions corresponding to individual LED chips can be configured to provide similar or different colors that are combined to provide an overall light output for the LED package. In other multiple LED chip packages, emissions corresponding to different LED chips can be configured to provide different emission characteristics for such packages. There can be challenges in producing high quality light with desired emission characteristics in single LED chip and multiple LED chip packages, particularly for higher light output applications with smaller package sizes.

The art continues to seek improved LEDs and solid-state lighting devices having desirable illumination characteristics capable of overcoming challenges associated with conventional lighting devices.

SUMMARY

The present disclosure relates to solid-state lighting devices including light-emitting diodes (LEDs), and more particularly to LEDs and packaged LED devices with spacer layer arrangements. An LED package may include one or more LED chips on a submount with a light-altering material arranged to redirect light in a desired emission direction with increased efficiency. A spacer layer is arranged in the LED package to cover rough surfaces and any gaps that may be formed between adjacent LED chips. When the light-altering material is applied to the LED package, the spacer layer provides a surface that reduces unintended propagation of the light-altering material toward areas of the LED package that would interfere with desired light emissions, for example over LED chips and between LED chips. In various arrangements, the spacer layer may cover one or more surfaces of a lumiphoric material, one or more LED chip surfaces, and portions of an underlying submount.

In one aspect, an LED package comprises: a submount; at least one LED chip on the submount, wherein the at least one LED chip comprises a first face mounted to the submount and a second face that opposes the first face; a lumiphoric material on the second face; a light-altering material on the submount and arranged along a perimeter of the at least one LED chip; a spacer layer on the lumiphoric material, wherein the spacer layer extends between the light-altering material and the submount; and an encapsulant layer on the spacer layer and the light-altering material. In certain embodiments, the at least one LED chip comprises a first LED chip and a second LED chip arranged on the submount to form a gap between the first LED chip and the second LED chip, and the spacer layer is in the gap. In certain embodiments, the lumiphoric material is between the spacer layer and the submount in the gap and in other embodiments, the spacer layer is between the lumiphoric material and the submount in the gap.

In certain embodiments, a thickness of the spacer layer as measured in a direction perpendicular to the submount is less than a thickness of the at least one LED chip as measured in a direction perpendicular to the submount. The thickness of the spacer layer may further be in a range from 1% to 50% of the thickness of the at least one LED chip. In certain embodiments, a thickness of the spacer layer as measured in a direction perpendicular to the submount is less than a thickness of the lumiphoric material as measured in a direction perpendicular to the submount.

In certain embodiments, a portion of the lumiphoric material may be arranged between the light-altering material and the submount. The encapsulant layer may form a lens on the spacer layer and the light-altering material. In certain embodiments, the lens comprises a planar top surface and in other embodiments, the lens comprises a curved top surface. In certain embodiments, the spacer layer comprises silicone. In certain embodiments, the light-altering material comprises one or more of light-reflecting particles, light-absorbing particles, and light-refracting particles. In certain embodiments, a lateral distance between the light-altering material and the at least one LED chip is less than 100 microns.

In another aspect, an LED package comprises: at least one LED chip; a lumiphoric material on the at least one LED chip; a light-altering material arranged along a perimeter of the at least one LED chip; a spacer layer on the lumiphoric material; and an encapsulant layer on the spacer layer and the light-altering material; wherein a peripheral sidewall of the LED package is formed by portions of the lumiphoric material, the spacer layer, the light-altering material, and the encapsulant layer. In certain embodiments, the spacer layer is between the light-altering material and the lumiphoric material at the peripheral sidewall of the LED package. The LED package may further comprise a submount that supports the at least one LED chip, wherein the peripheral sidewall of the LED package is formed by portions of the lumiphoric material, the spacer layer, the light-altering material, and the submount. The LED package may further comprise a reflective layer on the submount, wherein the reflective layer is between the lumiphoric material and the submount and the peripheral sidewall of the LED package is further formed by portions of the reflective layer.

In another aspect, a method of forming an LED package comprises: providing a first LED chip and a second LED chip on a submount; providing a lumiphoric material on the first LED chip and the second LED chip; forming a first portion of a spacer layer between the first LED chip and the second LED chip; forming a second portion of the spacer layer on the lumiphoric material and the first portion of the spacer layer; and forming a light-altering material on the submount and along a perimeter of the first LED chip and the second LED chip, wherein the second portion of the spacer layer resides between the light-altering material and the submount. In certain embodiments, forming the first portion of the spacer layer comprises: dispensing the first portion of the spacer layer in a gap formed between the first LED chip and the second LED chip; and allowing the first portion of the spacer layer to fill the gap formed between the first LED chip and the second LED chip by a wicking action. In certain embodiments, the first portion of the spacer layer is between the lumiphoric material and the submount in the gap. In other embodiments, the lumiphoric material is between the first portion of the spacer layer and the submount in the gap.

In another aspect, an LED package comprises: a submount; at least one LED chip on the submount, wherein the at least one LED chip comprises a first face mounted to the submount and a second face that opposes the first face; a light-altering material on the submount and arranged along a perimeter of the at least one LED chip; a spacer layer on the at least one LED chip and on a portion of the submount that is adjacent to the at least one LED chip, wherein the spacer layer extends between the light-altering material and the submount; and an encapsulant layer on the spacer layer and the light-altering material. In certain embodiments, the at least one LED chip comprises a first LED chip and a second LED chip arranged on the submount to form a gap between the first LED chip and the second LED chip, and the spacer layer is in the gap. In certain embodiments, a thickness of the spacer layer as measured in a direction perpendicular to the submount is less than a thickness of the at least one LED chip as measured in a direction perpendicular to the submount. In further embodiments, the thickness of the spacer layer is in a range from 1% to 50% of the thickness of the at least one LED chip. The encapsulant layer may form a lens on the spacer layer and the light-altering material. In certain embodiments, the light-altering material comprises one or more of light-reflecting particles, light-absorbing particles, and light-refracting particles. In certain embodiments, a lateral distance between the light-altering material and the at least one LED chip is less than 100 microns.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
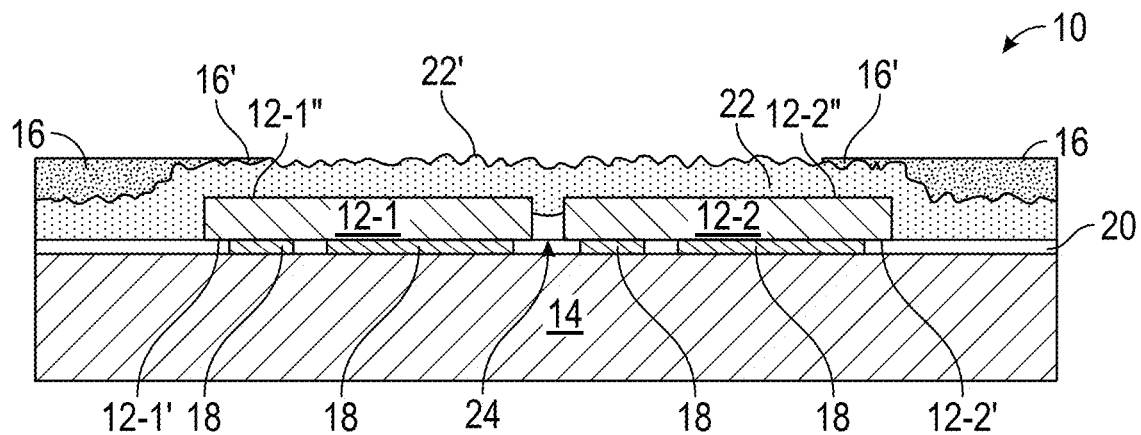
FIG. 1 is a cross-sectional view of a light-emitting diode (LED) package that includes LED chips mounted on a submount with a light-altering material arranged around a perimeter of the LED chips and where portions of the light-altering material are over the LED chips.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

The present disclosure relates to solid-state lighting devices including light-emitting diodes (LEDs), and more particularly to LEDs and packaged LED devices with spacer layer arrangements. An LED package may include one or more LED chips on a submount with a light-altering material arranged to redirect light in a desired emission direction with increased efficiency. A spacer layer is arranged in the LED package to cover rough surfaces and any gaps that may be formed between adjacent LED chips. When the light-altering material is applied to the LED package, the spacer layer provides a surface that reduces unintended propagation of the light-altering material toward areas of the LED package that would interfere with desired light emissions, for example over LED chips and between LED chips. In various arrangements, the spacer layer may cover one or more surfaces of a lumiphoric material, one or more LED chip surfaces, and portions of an underlying submount.

The terms "solid-state light emitter" or "solid-state emitter" (which may be qualified as being "electrically activated") may include an LED, laser diode, organic LED, and/or other semiconductor device which includes one or more semiconductor layers, which may include silicon (Si), silicon carbide (SiC), gallium nitride (GaN) and/or other semiconductor materials, a substrate which may include sapphire, Si, SiC and/or other microelectronic substrates, and one or more contact layers which may include metal and/or other conductive materials.

Solid-state light emitters, such as LEDs or LED chips, typically comprise an active LED structure or region that can have many different semiconductor layers arranged in different ways. The fabrication and operation of LEDs and their active structures are generally known in the art and are only briefly discussed herein. The layers of the active LED structure can be fabricated using known processes with a suitable process being fabrication using metal organic chemical vapor deposition (MOCVD). The layers of the active LED structure can comprise many different layers and generally comprise an active layer sandwiched between n-type and p-type oppositely doped epitaxial layers, all of which are formed successively on a growth substrate. It is understood that additional layers and elements can also be included in the active LED structure, including but not limited to, buffer layers, nucleation layers, super lattice structures, undoped layers, cladding layers, contact layers, current-spreading layers, and light extraction layers and elements. The active layer can comprise a single quantum well, a multiple quantum well, a double heterostructure, or super lattice structures.

The active LED structure can be fabricated from different material systems, with some material systems being Group III nitride-based material systems. Group III nitrides refer to those semiconductor compounds formed between nitrogen and the elements in Group III of the periodic table, usually aluminum (Al), gallium (Ga), and indium (In). Gallium nitride (GaN) is a common binary compound. Group III nitrides also refer to ternary and quaternary compounds such as aluminum gallium nitride (AlGaN), indium gallium nitride (InGaN), and aluminum indium gallium nitride (AlInGaN). For Group III nitrides, silicon (Si) is a common n-type dopant and magnesium (Mg) is a common p-type dopant. Accordingly, the active layer, n-type layer, and p-type layer may include one or more layers of GaN, AlGaN, InGaN, and AlInGaN that are either undoped or doped with Si or Mg for a material system based on Group III nitrides. Other material systems include silicon carbide (SiC), organic semiconductor materials, and other Group III-V systems such as gallium phosphide (GaP), gallium arsenide (GaAs), and related compounds.

The active LED structure may be grown on a growth substrate that can include many materials, such as sapphire, SiC, aluminum nitride (AlN), and GaN, with a suitable substrate being a 4H polytype of SiC, although other SiC polytypes can also be used including 3C, 6H, and 15R polytypes. SiC has certain advantages, such as a closer crystal lattice match to Group III nitrides than other substrates and results in Group III nitride films of high quality. SiC also has a very high thermal conductivity so that the total output power of Group III nitride devices on SiC is not limited by the thermal dissipation of the substrate. Sapphire is another common substrate for Group III nitrides and also has certain advantages, including being lower cost, having established manufacturing processes, and having good light transmissive optical properties.

Different embodiments of active LED structures can emit different wavelengths of light depending on the composition of the active layer and n-type and p-type layers. For example, the active LED structure for various LEDs may emit blue light with a peak wavelength range of approximately 430 nanometers (nm) to 480 nm, green light with a peak wavelength range of 500 nm to 570 nm, or red or red-orange light with a peak wavelength range of 600 nm to 650 nm. In certain embodiments, red light may include a peak wavelength range of 600 nm to 700 nm, or 650 nm to 700 nm depending on the application. The LED chip can also be covered with one or more lumiphoric materials or other conversion materials, such as phosphors, such that at least some of the light from the LED chip is absorbed by the one or more lumiphoric materials and is converted to one or more different wavelength spectra according to the characteristic emission from the one or more lumiphoric materials. In certain embodiments, the combination of the LED chip and the one or more lumiphoric materials provides generally white or near white aggregate light emissions. Such lumiphoric materials may include one or more phosphors such as yellow (e.g., YAG:Ce), green (e.g., LuAg:Ce), and red (e.g., $Ca_{1-x-y}Sr_xEu_yAlSiN_3$) emitting phosphors, and combinations thereof. In certain embodiments, aggregate emissions of one or more LEDs, optionally in combination with one or more lumiphoric materials, may be arranged to provide cool white, neutral white, or warm white light, such as within a color temperature range of from 2500 Kelvin (K) to 10,000K. In further embodiments, the color temperature range may be from 1500K to 10,000K. In certain embodiments, lumiphoric materials having various combinations of one or more cyan, green, amber, yellow, orange, and red dominant or peak wavelengths may be used.

As used herein, lumiphoric materials (which may also be known as lumiphors and/or luminescent materials) are configured to absorb a portion of emissions having a first peak wavelength emitted by a solid-state emitter and re-emit light having a second peak wavelength that differs from the first peak wavelength. Lumiphoric materials as described herein may be or include one or more of a phosphor, a scintillator, a lumiphoric ink, a quantum dot material, and a day glow tape, among others. Lumiphoric materials may be provided by any suitable means, for example, direct coating on one or more surfaces of an LED, dispersal in an encapsulant material configured to cover one or more LEDs, and/or coating on one or more optical or support elements (e.g., by powder coating, inkjet printing, or the like). In certain embodiments, lumiphoric materials may be downconverting or upconverting, and combinations of both downconverting and upconverting materials may be provided. In certain embodiments, multiple different (e.g., compositionally different) lumiphoric materials arranged to produce different peak wavelengths may be arranged to receive emissions from one or more LED chips.

As used herein, a layer or region of a light-emitting device may be considered to be "transparent" when at least 80% of emitted radiation that impinges on the layer or region emerges through the layer or region. Moreover, as used herein, a layer or region of an LED is considered to be "reflective" or embody a "mirror" or a "reflector" when at least 80% of the emitted radiation that impinges on the layer or region is reflected. In certain embodiments, the emitted radiation comprises visible light such as blue and/or green LEDs with or without lumiphoric materials. In other embodiments, the emitted radiation may comprise nonvisible light. For example, in the context of GaN-based blue and/or green LEDs, silver (for example, at least 80% reflective) may be considered a reflective material. In the case of ultraviolet (UV) LEDs, appropriate materials may be selected to provide a desired, and in certain embodiments high, reflectivity, and/or a desired, and in certain embodiments low, absorption. In certain embodiments, a "light-transmissive" material may be configured to transmit at least 50% of emitted radiation of a desired wavelength. In certain embodiments, an initially "light-transmissive" material may be altered to be a "light-absorbing material" that transmits less than 50% of emitted radiation of a desired wavelength with the addition of one or more light-absorbing materials, such as opaque or non-reflective materials including grey, dark, or black particles or materials.

The present disclosure can be useful for LED chips having a variety of geometries, such as vertical geometry or lateral geometry. A vertical geometry LED chip typically includes anode and cathode connections on opposing sides or faces of the LED chip. A lateral geometry LED chip typically includes both anode and cathode connections on the same side or face of the LED chip that is opposite a substrate, such as a growth substrate. In an LED package, a lateral geometry LED chip may be mounted on a submount of the LED package such that the anode and cathode are on a face of the active LED structure that is opposite the submount. In this arrangement, wirebonds may be used to provide electrical connections with the anode and cathode. Certain embodiments disclosed herein relate to the use of flip chip LED devices in which a light transmissive substrate represents an exposed light-emitting surface. In such arrangements, the anodes and cathodes of LED chips that are flip-chip mounted may be mounted or bonded to electrical traces or patterns on the submount of the corresponding LED package. LED packages as disclosed herein may include arrangements that include one or more of submounts, electrical connections, light-altering materials, reflective materials, encapsulants, lenses, optics, and lumiphoric materials on or supporting one or more LED chips.

According to aspects of the present disclosure, LED packages may include one or more elements, such as lumiphoric materials, encapsulants, light-altering materials, lens, and electrical contacts, among others, that are provided in arrangements relative to one or more LED chips. In certain aspects, an LED package may include a support member, such as a submount or a leadframe. Light-altering materials may be arranged within LED packages to reflect or otherwise redirect light from the one or more LED chips in a desired emission direction or pattern.

As used herein, light-altering materials may include many different materials including light-reflective materials that reflect or redirect light, light-absorbing materials that absorb light, and materials that act as a thixotropic agent. As used herein, the term "light-reflective" refers to materials or particles that reflect, refract, scatter, or otherwise redirect light. For light-reflective materials, the light-altering material may include at least one of fused silica, fumed silica, titanium dioxide ($TiO_2$), or metal particles suspended in a binder, such as silicone or epoxy. In certain aspects, the particles may have an index of refraction that is configured to refract light emissions in a desired direction. The index of refraction may be index-matched to one or more adjacent elements. In certain aspects light-reflective particles may also be referred to as light-scattering particles. For applications where the light-altering material forms a reflector, the light-altering particles should have a sufficient loading in the light-altering material in order to reflect and redirect light without allowing significant amounts of light to pass through the light-altering material. A weight ratio of the light-reflective particles or scattering particles to a binder may comprise a range of about 1:1 to about 2:1, or a range of 1:100 to 2:1. For light-absorbing materials, the light-altering material may include at least one of carbon, silicon, or metal particles suspended in a binder, such as silicone or epoxy. The light-reflective materials and the light-absorbing materials may comprise nanoparticles. In certain embodiments, the light-altering material may comprise a generally white color to reflect and redirect light. In other embodiments, the light-altering material may comprise a generally opaque or black color for absorbing light and increasing contrast.

In certain embodiments, the light-altering material includes both light-reflective material and light-absorbing material suspended in a binder. A weight ratio of the light-reflective material to the binder may comprise a range of about 1:1 to about 2:1, or a range of 1:100 to 2:1. A weight ratio of the light-absorbing material to the binder may comprise a range of about 1:400 to about 1:10. In certain embodiments, a total weight of the light-altering material includes any combination of the binder, the light-reflective material, and the light-absorbing material. In some embodiments, the binder may comprise a weight percent that is in a range of about 10% to about 90%, or a range from 1% to 90% of the total weight of the light-altering material. The light-reflective material may comprise a weight percent that is in a range of about 10% to about 90%, or a range from 1% to 90% of the total weight of the light-altering material. The light-absorbing material may comprise a weight percent that is in a range of about 0% to about 15% of the total weight of the light-altering material.

In further embodiments, the light-absorbing material may comprise a weight percent that is in a range of about greater than 0% to about 15% of the total weight of the light-altering material. In further embodiments, the binder may comprise a weight percent that is in a range of about 25% to about 70% of the total weight of the light-altering material. The light-reflective material may comprise a weight percent that is in a range of about 25% to about 70% of the total weight of the light-altering material. The light-absorbing material may comprise a weight percent that is in a range of about 0% to about 5% of the total weight of the light-altering material. In further embodiments, the light-absorbing material may comprise a weight percent that is in a range of about greater than 0% to about 5% of the total weight of the light-altering material.

FIG. 1 is a cross-sectional view of an LED package 10 that includes LED chips 12-1, 12-2 mounted on a submount 14 with a light-altering material 16 arranged around a perimeter of the LED chips 12-1, 12-2. The LED chips 12-1, 12-2 include first faces 12-1', 12-2', respectively, that are mounted to the submount 14 and second faces 12-1", 12-2" that are opposite the first faces 12-1', 12-2', respectively. In this manner, the second faces 12-1", 12-2" of the LED chips 12-1, 12-2 form a primary light-emitting surface for the LED package 10. In FIG. 1, electrical connections 18 are provided on the submount 14 for receiving the LED chips 12-1, 12-2 in a flip-chip configuration, although the principles of the present disclosure are applicable to other LED chip configurations. A reflective layer 20 may be provided on the submount 14 and between the electrical connections 18 to redirect light that may travel toward the submount 14. The reflective layer 20 may comprise an electrically insulating reflective layer. In certain embodiments, the reflective layer 20 may comprise a generally white color formed by loading light-altering particles in a binder.

A lumiphoric material 22 is provided on the second faces 12-1", 12-2" of the LED chips 12-1, 12-2 and on portions of the submount 14 that are uncovered by the LED chips 12-1, 12-2. The lumiphoric material 22 typically includes one or more types of lumiphoric particles that are provided within a binder. Each type of lumiphoric particle present may typically include a distribution of particle sizes. Depending on relative sizes of lumiphoric particles in the lumiphoric material 22, a gap 24 that is formed between the LED chips 12-1, 12-2 may be at least partially filled with the lumiphoric material 22, although the gap can also be at least partially devoid of the lumiphoric material. Due to particle size distributions and any grouping or clumping together of lumiphoric particles within the binder, a top surface 22' of the lumiphoric material 22 can be nonplanar. In particular, the top surface 22' may include irregular protrusions and depressions that generally follow a shape of lumiphoric particles or groups of lumiphoric particles that are near the top surface 22'. The light-altering material 16 may be applied along a perimeter of the LED chips 12-1, 12-2 by a dispensing process. In certain embodiments, the light-altering material 16 may comprise a generally white color formed by loading of light-altering particles in a binder. The light-altering material 16 may comprise similar materials to the reflective layer 20 or different materials than the reflective layer 20, depending on the particular embodiment. During dispensing, the nonplanar top surface 22' of the lumiphoric material 22 can promote unintended, propagation, flow, or wicking of portions 16' of the light-altering material 16 across the lumiphoric material 22 and over portions of the LED chips 12-1, 12-2. In this manner, the portions 16' of the light-altering material 16 that are over the LED chips 12-1, 12-2 can decrease an overall light output of the LED package and further define an irregular light-emission area for the LED package 10.

Figure 2:
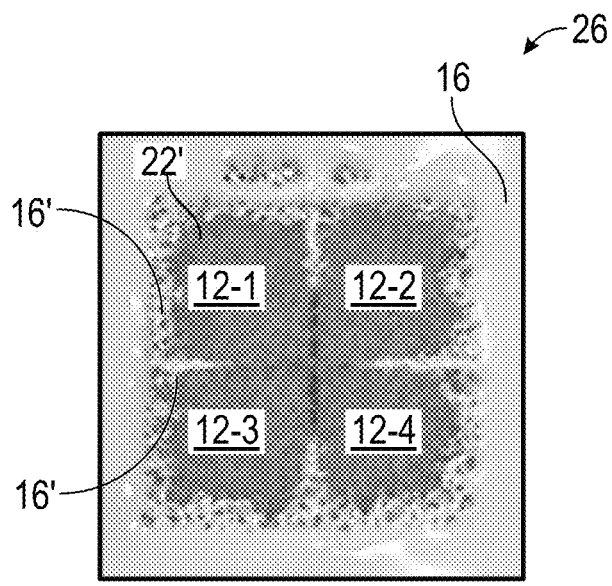
FIG. 2 is a top view image at a fabrication step for an LED package where portions of the light-altering material have formed over the LED chips by unintended propagation.

FIG. 2 is a top view image 26 at a fabrication step for forming an LED package where portions 16' of the light-altering material 16 have formed over LED chips 12-1 to 12-4 by unintended propagation. The fabrication step shown in the image 26 is at a step before individual LED packages are separated from a larger panel. An array of the LED chips 12-1 to 12-4 is labeled that will form an individual LED package after separation. At the panel level, the light-altering material 16 may be deposited along intersecting lines that laterally surround the LED chips 12-1 to 12-4. As previously described, the nonplanar top surface 22' of the lumiphoric material 22 that may be provided on the LED chips 12-1 to 12-4 promotes unintended propagation, such as flow or wicking. As illustrated in the image 26, the portions 16' of the light-altering material 16 extend over the LED chips 12-1 to 12-4 and in gaps between adjacent ones of the LED chips 12-1 to 12-4. In addition to blocking some light from escaping in a desired emission direction, the portions 16' also define an irregular light-emission area for the resulting LED package.

Figure 3:
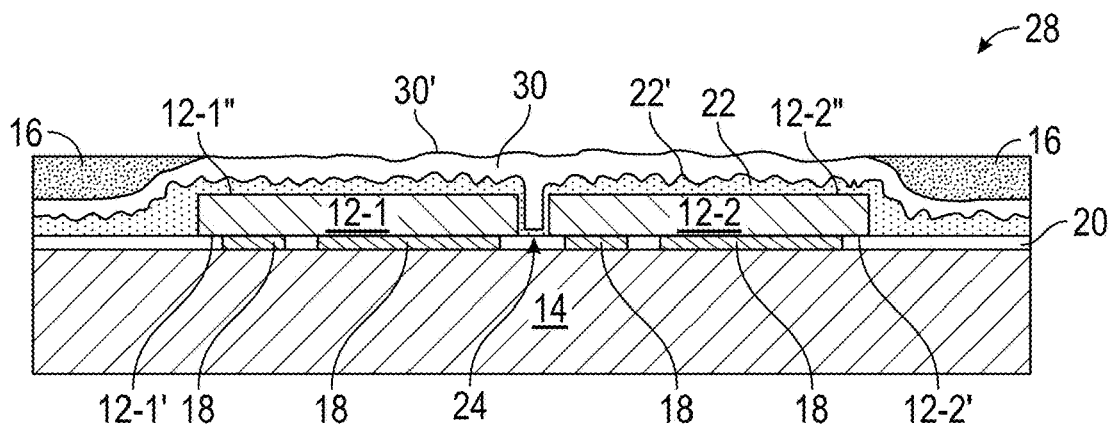
FIG. 3 is a cross-sectional view of an LED package that includes a spacer layer that is arranged to discourage propagation of the light-altering material over LED chips according to principles of the present disclosure.

FIG. 3 is a cross-sectional view of an LED package 28 that includes a spacer layer 30 that is arranged to discourage propagation of the light-altering material 16 over the LED chips 12-1, 12-2 according to principles of the present disclosure. The spacer layer 30 is provided to cover one or more portions of the lumiphoric material 22 and fill in any irregularities in the top surface 22' thereof. In this manner, a top surface 30' of the spacer layer 30 provides a smoother surface for the light-altering material 16, thereby discouraging propagation of the light-altering material 16 over the LED chips 12-1, 12-2 when the light-altering material 16 is applied. Accordingly, the light-altering material 16 may form a more even boundary around a perimeter of the LED chips 12-1, 12-2 to define a light-emission surface for the LED package 28 with improved uniformity.

In certain embodiments, the spacer layer 30 comprises a same material as a binder material for the lumiphoric material 22, such as silicone. In other embodiments, the spacer layer 30 comprises a different material than the binder material. The spacer layer 30 may be light-transmissive or even light-transparent to wavelengths of light generated by the LED chips 12-1, 12-2 and to wavelengths of light produced by wavelength conversion in the lumiphoric material 22. In FIG. 3, the lumiphoric material 22 is arranged to extend over portions of the submount 14 that are adjacent to and uncovered by the LED chips 12-1, 12-2. In a like manner, the spacer layer 30 may also extend over portions of the submount 14 that are adjacent to and uncovered by the LED chips 12-1, 12-2. Accordingly, portions of the top surface 22' of the lumiphoric material 22 that are between the light-altering material 16 and the submount 14 are covered by the spacer layer 30. In this regard, the spacer layer 30 is arranged to extend between the light-altering material 16 and the submount 14. Additionally, a portion of the spacer layer 30 may be arranged in the gap 24 between the LED chips 12-1, 12-2 to discourage propagation of the light-altering material 16 in the gap 24. When the lumiphoric material 22 is relatively thin compared to the LED chips 12-1, 12-2, portions of the lumiphoric material 22 may be provided on the submount 14 in the gap 24 in an arrangement that is between the spacer layer 30 and the submount 14. As will be later described in more detail, the spacer layer 30 may be formed by a two-step process where a first portion of the spacer layer 30 is initially provided in the gap 24 and a second portion, or a remainder of the spacer layer 30 is provided as a conformal coating.

In certain embodiments, the spacer layer 30 has a thickness that is relatively thin compared with the lumiphoric material 22, while still being able to sufficiently cover the top surface 22' of the lumiphoric material 22. In particular, the thickness of the spacer layer 30 as measured in a direction perpendicular to the submount 14 may be less than a thickness of the lumiphoric material 22, or less than a thickness of the LED chips 12-1, 12-2 as measured in the same direction. In certain embodiments, the thickness of the spacer layer 30 is in a range from 1% to 50% of the thickness of the lumiphoric material 22, or in a range from 1% to 50% of the thickness of the LED chips 12-1, 12-2. By keeping the spacer layer 30 relatively thin, unintended propagation of the light-altering material 16 may be reduced without adding excessive bulk to the LED package 28. Additionally, portions of the light-altering material 16 may be arranged closer to the submount 14 in order to still reflect and redirect lateral emissions from the LED chips 12-1, 12-2 in an intended emission direction for the LED package 28. For example, a lateral distance between the light-altering material 16 and a perimeter edge of one or more of the LED chips 12-1, 12-2 may be less than 100 microns (μm), or less than 30 μm, or less than 20 μm, or less than 10 μm, or less than 1 μm.

Figure 4:
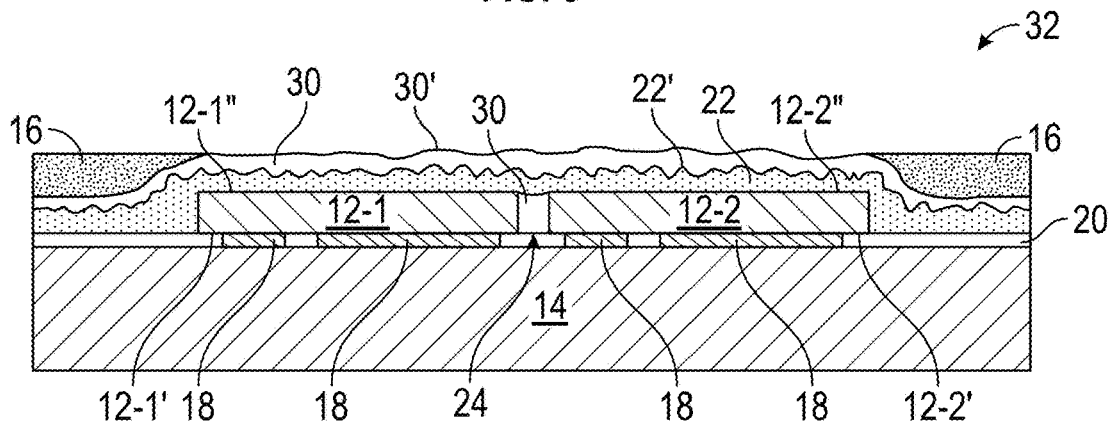
FIG. 4 is a cross-sectional view of an LED package that is similar to the LED package of FIG. 3 but where a lumiphoric material does not entirely cover portions of the submount in a gap formed between the LED chips.

FIG. 4 is a cross-sectional view of an LED package 32 that is similar to the LED package 28 of FIG. 3 but where the lumiphoric material 22 does not entirely cover portions of the submount 14 in the gap 24 between the LED chips 12-1, 12-2. Depending on the wavelength conversion requirements for a particular application, the lumiphoric material 22 may have a thickness and/or a particle size distribution such that portions of the gap 24 between the LED chips 12-1, 12-2 may not be entirely filled with the lumiphoric material 22. Such portions may promote unintended propagation of the light-altering material 16 into the gap 24. As illustrated in FIG. 4, a portion of the spacer layer 30 may be provided to fill any openings in the gap 24 that are unfilled by the lumiphoric material 22, thereby reducing unintended propagation of the light-altering material 16. In order to suitably fill the gap 24 after the lumiphoric material 22 is formed, a portion of the spacer layer 30 may initially be applied over the gap 24 and allowed to wick or otherwise propagate though any openings or voids (not shown) in the lumiphoric material 22. In a following step, the remainder of the spacer layer 30 may be provided as a conformal coating over the lumiphoric material 22. In this manner, the spacer layer 30 may fill spaces in the gap 24 that may otherwise be filled by wicking or other propagation of the light-altering material 16 at a subsequent fabrication step.

Figure 5:
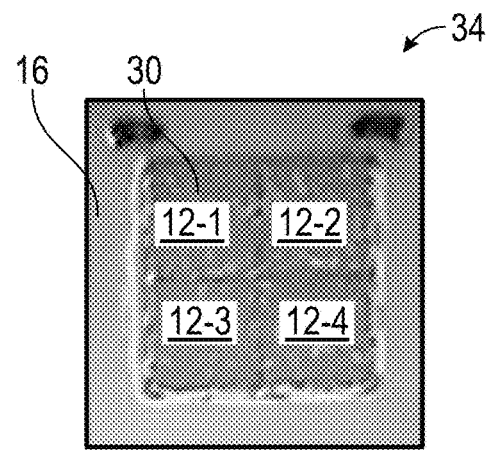
FIG. 5 is a top view image at a fabrication step for an LED package similar to the LED package of FIG. 3 or the LED package of FIG. 4 where unintended propagation of the light-altering material is reduced.

FIG. 5 is a top view image 34 at a fabrication step for forming an LED package similar to the LED package 28 of FIG. 3 or the LED package 32 of FIG. 4 where unintended propagation of the light-altering material 16 is reduced. The fabrication step shown in the image 34 is at a step before individual LED packages are separated from a larger panel. An array of the LED chips 12-1 to 12-4 is labeled that will form an individual LED package after separation. By coating the spacer layer 30 over the lumiphoric material (22 of FIG. 3 or FIG. 4), the light-altering material 16 may be dispensed along intersecting lines that laterally surrounds the array of LED chips 12-1 to 12-4 with reduced propagation over the LED chips 12-1 to 12-4. In this manner, a light-emitting surface that is defined where the light-altering material 16 ends relative to the array of LED chips 12-1 to 12-4 is provided in a more uniform manner. Accordingly, increased light emissions with increased uniformity of emission profiles may be realized for the resulting LED package. Additionally, reduced propagation allows the light-altering material 16 to be positioned closer to the LED chips 12-1 to 12-4 for improved reflecting and redirecting of lateral light emissions.

FIGS. 6A-6D illustrate various fabrication steps for forming the LED package 28 of FIG. 3 that include a two-step sequence for providing the spacer layer 30 according to principles of the present disclosure. While the LED package 28 of FIG. 3 is selected to show examples of the fabrication steps, the principles discloses are also applicable to other embodiments of the present disclosure, including the LED package 32 of FIG. 4 and all subsequently described embodiments.

Figure 6A:
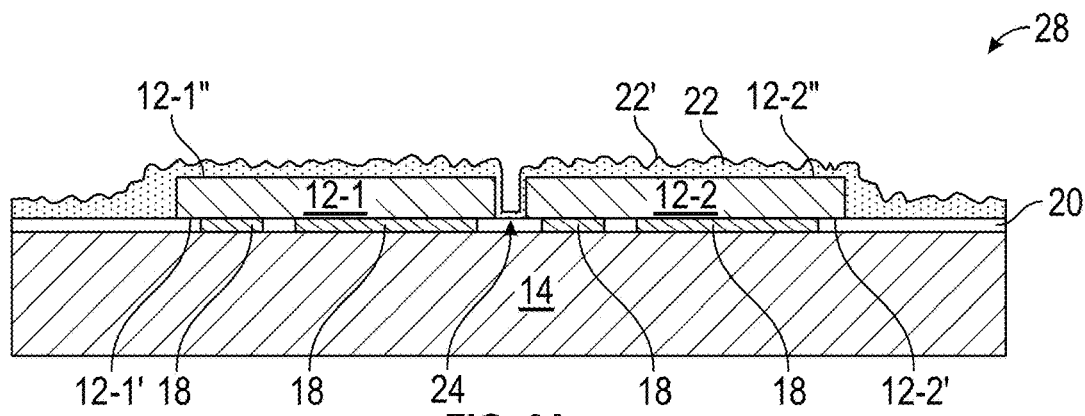
FIG. 6A is a cross-sectional view of the LED package of FIG. 3 at a fabrication step where the lumiphoric material has been provided.

FIG. 6A is a cross-sectional view of the LED package 28 after the lumiphoric material 22 has been provided. In certain embodiments, the lumiphoric material 22 may be applied in a conformal manner over the LED chips 12-1, 12-2 and on portions of the submount 14 that are uncovered by the LED chips 12-1, 12-2. As illustrated, the lumiphoric material 22 may also be provided on the submount 14 in the gap 24. In other embodiments, the lumiphoric material 22 may not entirely or directly cover the portion of the submount 14 as described for the LED package 32 of FIG. 4. The reflective layer 20 may be provided between the lumiphoric material 22 and the submount 14 and between the LED chips 12-1, 12-2 and the submount 14. In this manner, light from the LED chips 12-1, 12-2 or light converted by the lumiphoric material 22 that travels in a direction toward the submount 14 may be reflected or redirected in a desired emission direction for the LED package 28.

Figure 6B:
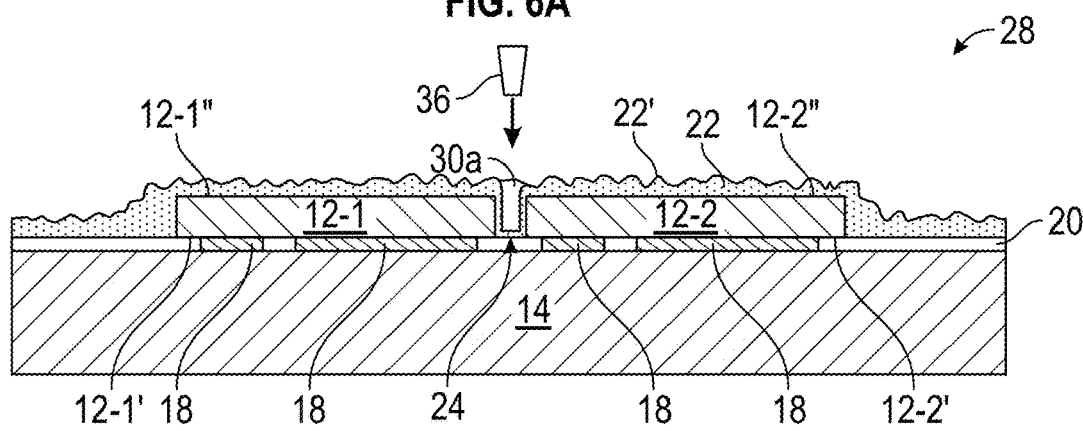
FIG. 6B is a cross-sectional view of the LED package of FIG. 6A at a fabrication step where a first portion of the spacer layer is formed in the gap between the LED chips.

FIG. 6B is a cross-sectional view of the LED package 28 after forming a first portion 30a of the spacer layer 30 in the gap 24 between the LED chips 12-1, 12-2. In certain embodiments, the first portion 30a of the spacer layer 30 may be provided by an initial dispensing step that is applied primarily to portions of the LED package 28 that are registered with the gap 24. In FIG. 6B, this is represented by a dispensing nozzle 36 that is registered with the gap 24. During dispensing, droplets of spacer layer material are applied directly over the gap 24 and the first portion 30a of the spacer layer 30 is allowed to flow into and fill the gap 24. In certain embodiments, the first portion 30a of the spacer layer 30 may flow and fill the gap 24 by a wicking action. In this manner, the initial dispensing step may ensure suitable filling of the gap 24 that may not necessarily occur during blanket application of the remainder of the spacer layer 30.

Figure 6C:
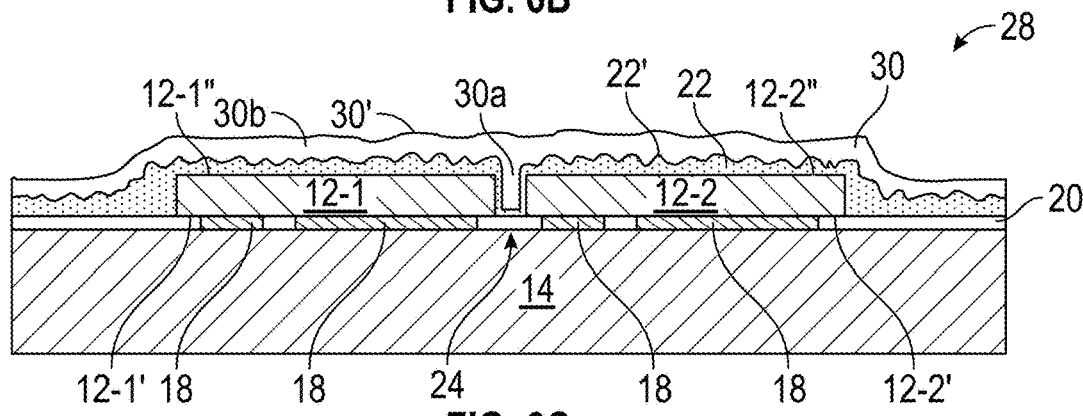
FIG. 6C is a cross-sectional view of the LED package of FIG. 6B at a fabrication step where a second portion of the spacer layer is formed on the lumiphoric material.

FIG. 6C is a cross-sectional view of the LED package 28 after forming a second portion 30b of the spacer layer 30 on the lumiphoric material 22. The second portion 30b may be provided to cover portions of the lumiphoric material 22 over the LED chips 12-1, 12-2 and over portions of the submount 14 that are uncovered by the LED chips 12-1, 12-2. The second portion 30b of the spacer layer 30 may be formed by blanket deposition or application over the top surface 22' of the lumiphoric material 22.

Figure 6D:
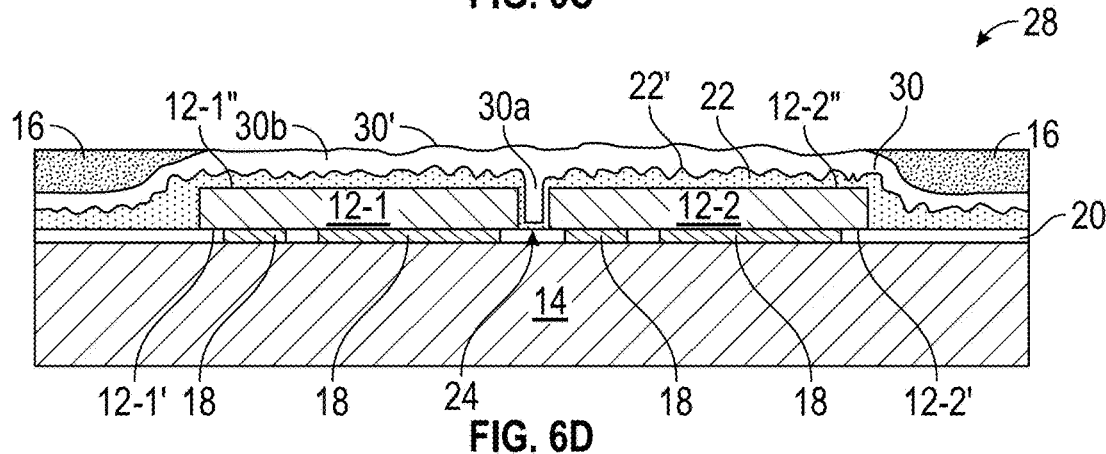
FIG. 6D is a cross-sectional view of the LED package of FIG. 6C at a fabrication step where the light-altering material is formed on the submount and along a perimeter of the LED chips.

FIG. 6D is a cross-sectional view of the LED package 28 after forming the light-altering material 16 on the submount 14 and along a perimeter of the LED chips 12-1, 12-2. The light-altering material 16 may be provided by a dispensing process along portions of the submount 14 that are uncovered by the LED chips 12-1, 12-2. By providing the spacer layer 30 in a previous step, the light-altering material 16 may be formed on the top surface 30' of the spacer layer 30 that is smoother than the top surface 22' of the lumiphoric material 22. In this manner, unintended flow and propagation of the light-altering material 16 over the LED chips 12-1, 12-2 may be reduced. As illustrated, the second portion 30b of the spacer layer 30 resides between the light-altering material 16 and the submount 14.

Figure 7A:
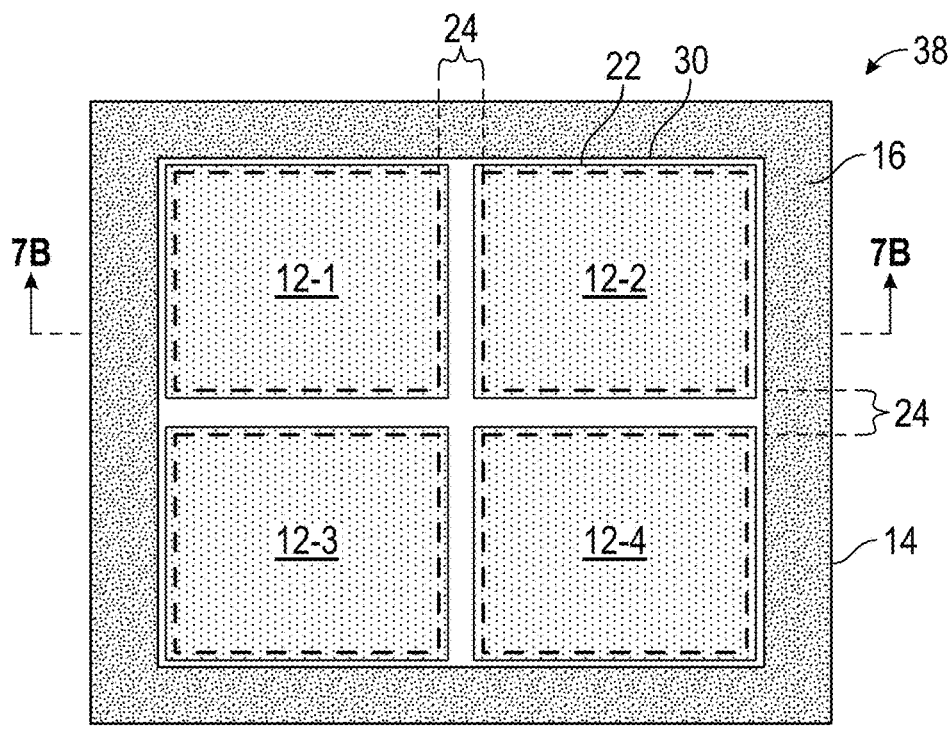
FIG. 7A is a top view of an exemplary LED package where the lumiphoric material covers the LED chips and the spacer layer is provided on the lumiphoric material according to principles of the present disclosure.

FIG. 7A is a top view of an exemplary LED package 38 where the lumiphoric material 22 covers the LED chips 12-1 to 12-4 and the spacer layer 30 is provided on the lumiphoric material 22 according to principles of the present disclosure. The LED package 38 is a multiple-chip package where the LED chips 12-1 to 12-4 form an array that is registered at a center of the submount 14. The LED chips 12-1 to 12-4 are blanket covered with the lumiphoric material 22 in a similar manner to LED package 28 of FIG. 3 or the LED package 32 of FIG. 4. For illustrative purposes, locations of the LED chips 12-1 to 12-4 underneath the lumiphoric material 22 are indicated as superimposed dashed-line squares. The spacer layer 30 is arranged to fill portions of the gaps 24 between adjacent ones of the LED chips 12-1 to 12-4 and cover the lumiphoric material 22 as previously described. In this manner, the light-altering material 16 may be arranged around a perimeter of the array of LED chips 12-1 to 12-4 with reduced propagation over the LED chips 12-1 to 12-4, thereby defining a uniform light-emitting surface for the LED package 38.

Figure 7B:
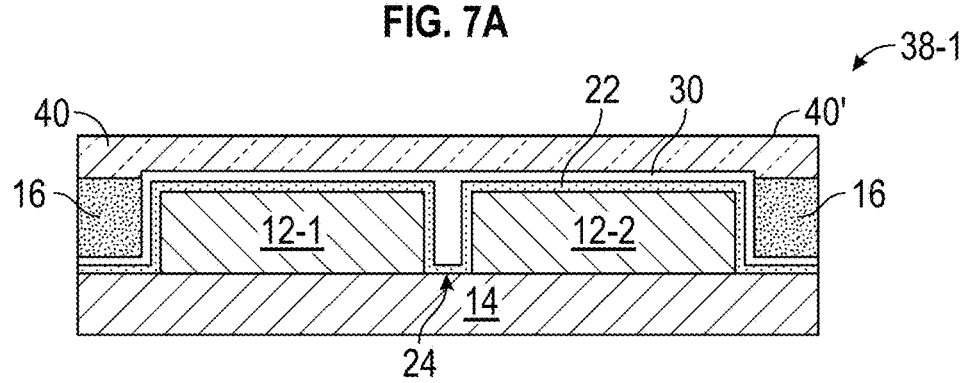
FIG. 7B is a cross-sectional view taken along the sectional line 7B-7B of FIG. 7A for an LED package that further includes an encapsulant with a planar upper surface.
Figure 7C:
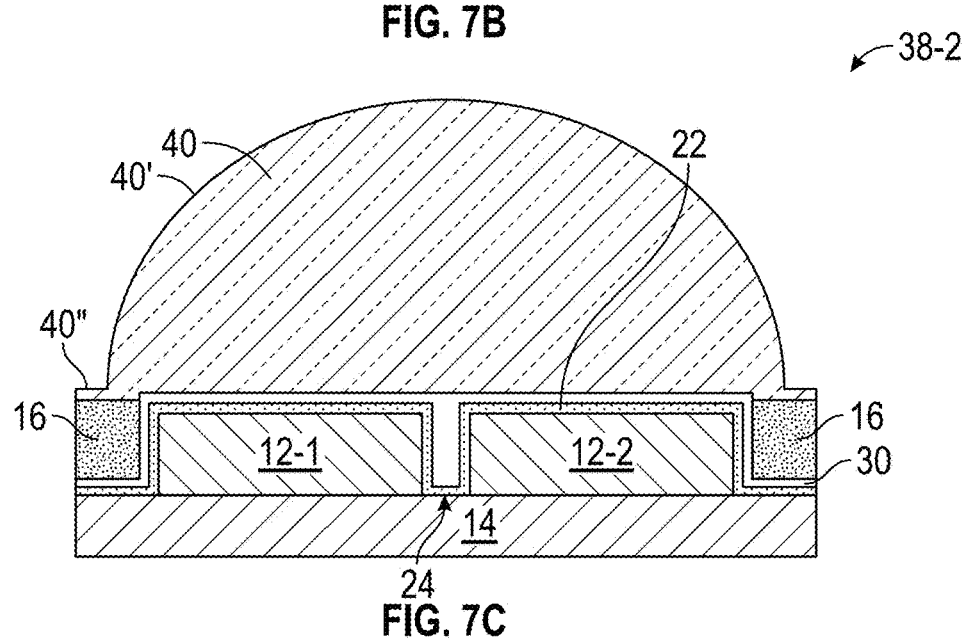
FIG. 7C is a cross-sectional view that is similar to the cross-sectional view of FIG. 7B for an LED package that further includes an encapsulant with a curved upper surface.

FIGS. 7B and 7C illustrate cross-sectional views taken along the sectional line 7B-7B of FIG. 7A for LED packages 38-1, 38-2 that further include different configurations of an encapsulant 40. As used herein, the encapsulant 40 may also be referred to as an encapsulant layer. In FIG. 7B, the encapsulant 40 of the LED package 38-1 forms a flat lens that has a planar upper surface 40'. As illustrated, the encapsulant 40 may be provided to entirely cover the spacer layer 30 and the light-altering material 16 over the submount 14. In certain embodiments, the encapsulant 40 may comprise a same material as the spacer layer 30, for example silicone, while in other embodiments, the encapsulant 40 may comprise a different material. As previously described, the spacer layer 30 discourages flow of the light-altering material 16 over the LED chips 12-1, 12-2. In FIG. 7C, the encapsulant 40 of the LED package 38-2 forms a lens with a dome shape having a curved upper surface 40'. In this manner the encapsulant 40 may tailor an emission pattern for the LED package 38-2. Depending on the desired emission pattern, the curved upper surface 40' may or may not extend entirely to an edge of the submount 14. In FIG. 7C, the curved upper surface 40' does not extend entirely to the edge of the submount 14 and a portion 40" of the encapsulant 40 protrudes from the curved upper surface 40' to form a protective layer that covers remaining portions of the light-altering material 16 on the submount 14.

Figure 8A:
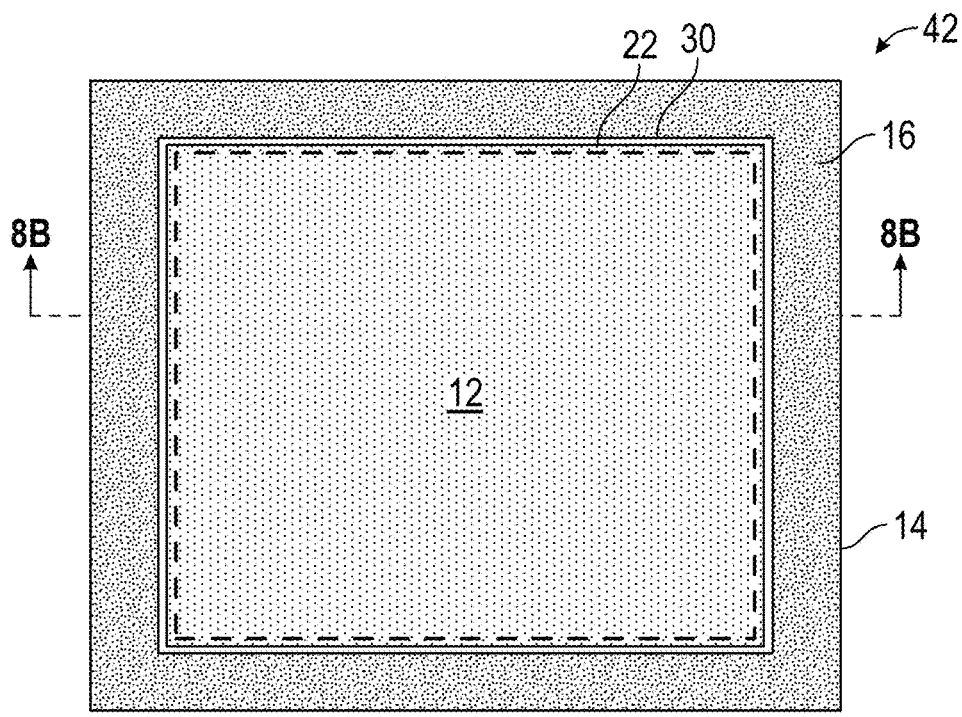
FIG. 8A is a top view of an exemplary LED package that is similar to the LED package of FIG. 7A, but for a single LED chip embodiment according to principles of the present disclosure.

FIG. 8A is a top view of an exemplary LED package 42 that is similar to the LED package 38 of FIG. 7A, but for a single LED chip embodiment according to principles of the present disclosure. An LED chip 12 of the LED package 42 is registered at a center of the submount 14 and the LED chip 12 is blanket covered with the lumiphoric material 22. For illustrative purposes, a location of the LED chip 12 underneath the lumiphoric material 22 is indicated by a superimposed dashed-line square. The spacer layer 30 is arranged to cover the lumiphoric material 22 as previously described. In this manner, the light-altering material 16 may be arranged around a perimeter of the LED chip 12 with reduced unintended propagation, thereby defining a uniform light-emitting surface for the LED package 42.

Figure 8B:
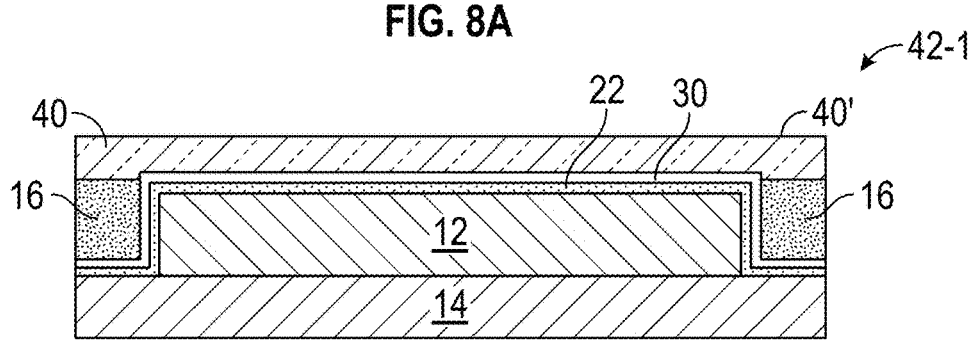
FIG. 8B is a cross-sectional view taken along the sectional line 8B-8B of FIG. 8A for an LED package that further includes an encapsulant with a planar upper surface.
Figure 8C:
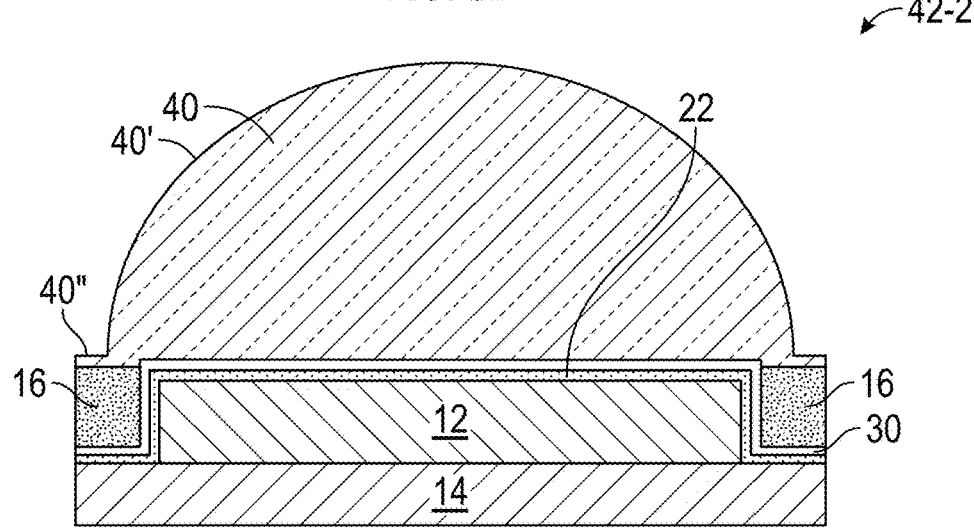
FIG. 8C is a cross-sectional that is similar to the cross-sectional view of FIG. 8B for an LED package that further includes an encapsulant with a curved upper surface.

FIGS. 8B and 8C illustrate cross-sectional views taken along the sectional line 8B-8B of FIG. 8A for LED packages 42-1, 42-2 that further include different configurations of the encapsulant 40. In FIG. 8B, the encapsulant 40 forms a flat lens that includes a planar upper surface 40' in a similar manner as described above for FIG. 7B. In FIG. 8C, the encapsulant 40 forms a lens with a dome shape with a curved upper surface 40' in a similar manner as described above for FIG. 7C. For the single LED chip embodiments illustrated in FIGS. 8A-8C, the lumiphoric material 22 is provided in a conformal manner on the LED chip 12 and portions of the submount 14 that are uncovered by the LED chip 12. The spacer layer 30 covers the lumiphoric material 22 and extends between the light-altering material 16 and the submount 14. The encapsulant 40 may reside on portions of the spacer layer 30 that are over the LED chip 12.

Figure 9A:
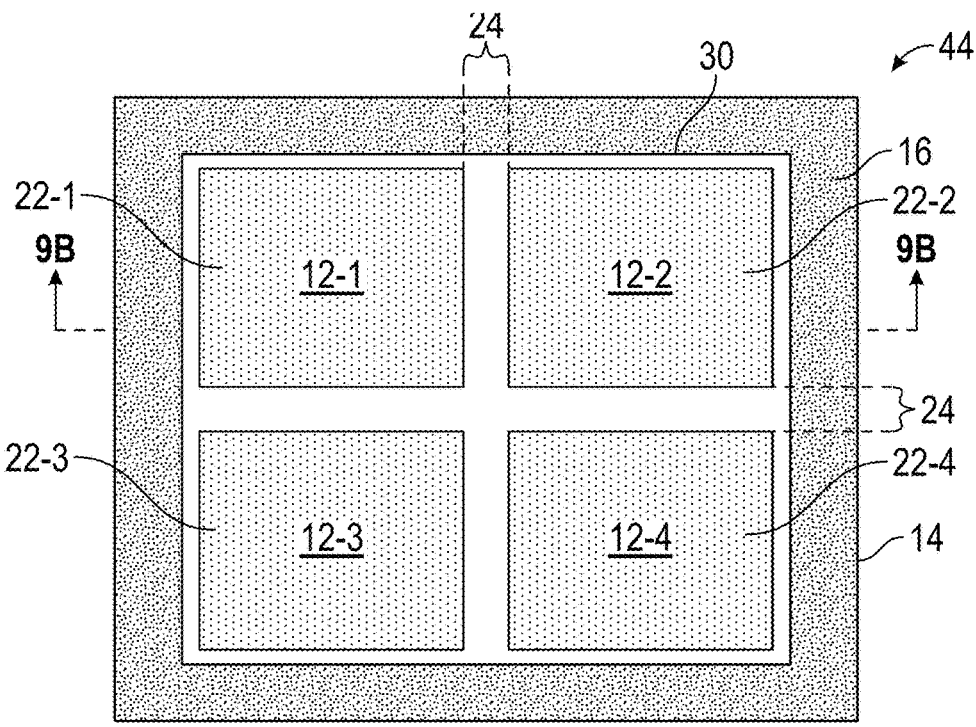
FIG. 9A is a top view of an exemplary LED package that is similar to the LED package of FIG. 7A, but for embodiments where each of the LED chips includes a separate lumiphoric material.

FIG. 9A is a top view of an exemplary LED package 44 that is similar to the LED package 38 of FIG. 7A, but for embodiments where each of the LED chips 12-1 to 12-4 includes a separate lumiphoric material 22-1 to 22-4. The lumiphoric materials 22-1 to 22-4 may be provided at the chip level before each of the LED chips 12-1 to 12-4 is mounted to the submount 14. Alternatively, the lumiphoric materials 22-1 to 22-4 may embody pre-formed structures that are attached after the LED chips 12-1 to 12-4 are mounted to the submount 14. In such embodiments, the lumiphoric materials 22-1 to 22-4 may comprise one or more of ceramic phosphor plates, phosphors in glass, and phosphor coatings that are formed on and supported by a transparent superstrate. In this manner, each individual lumiphoric material 22-1 to 22-4 is registered with a different one of the LED chips 12-1 to 12-4. In the top view of FIG. 9A, the LED chips 12-1 to 12-4 are underneath the lumiphoric materials 22-1 to 22-4. As further detailed below for FIG. 9B, the spacer layer 30 covers each individual lumiphoric material 22-1 to 22-4 and covers portions of the submount 14 in the gap 24 and portions of the submount 14 outside a periphery of the LED chips 12-1 to 12-4. The light-altering material 16 is accordingly formed on the spacer layer 30 around a periphery of the LED chips 12-1 to 12-4 with reduced unintended propagation as previously described.

Figure 9B:
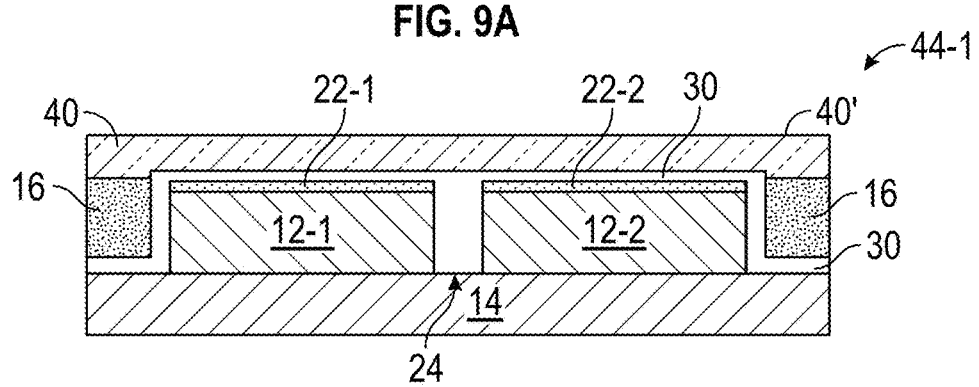
FIG. 9B is a cross-sectional view taken along the sectional line 9B-9B of FIG. 9A for an LED package that further includes an encapsulant with a planar upper surface.
Figure 9C:
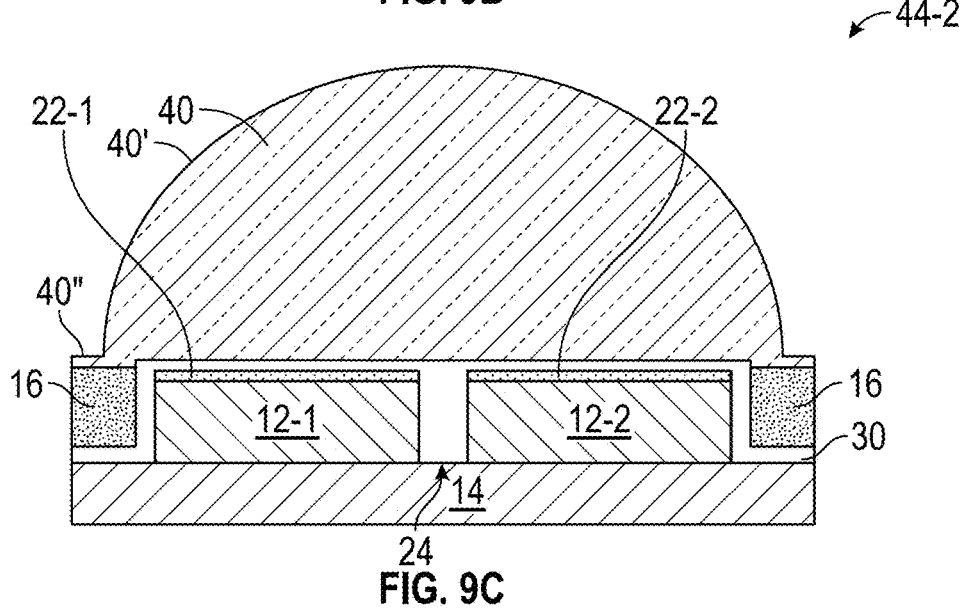
FIG. 9C is a cross-sectional view that is similar to the cross-sectional view of FIG. 9B for an LED package that further includes an encapsulant with a curved upper surface.

FIGS. 9B and 9C illustrate cross-sectional views taken along the sectional line 9B-9B of FIG. 9A for LED packages 44-1, 44-2 that further include different configurations of the encapsulant 40. In FIG. 9B, the encapsulant 40 forms a flat lens that includes a planar upper surface 40' in a similar manner as described above for FIG. 7B. In FIG. 9C, the encapsulant 40 forms a lens with a dome shape having a curved upper surface 40' in a similar manner as described above for FIG. 7C. As illustrated in FIGS. 9A-9C, when the lumiphoric materials 22-1 to 22-4 are registered with the LED chips 12-1 to 12-4 and not on portions of the submount 14 that are uncovered by the LED chips 12-1 to 12-4, the gap 24 between the LED chips 12-1 to 12-4 may be entirely filled with the spacer layer 30.

Figure 10A:
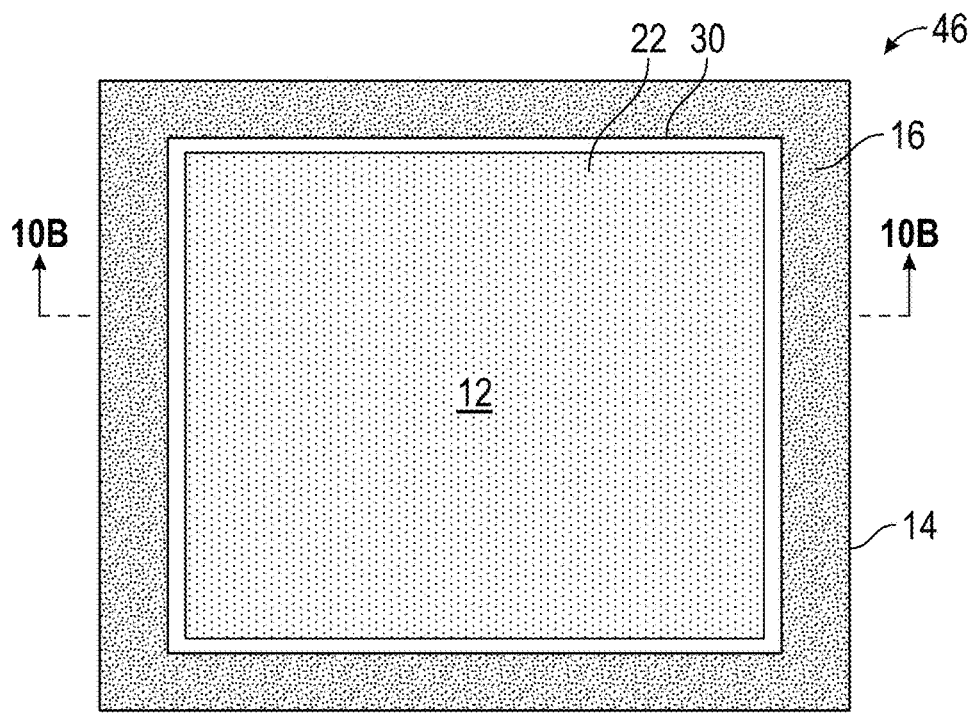
FIG. 10A is a top view of an exemplary LED package that is similar to the LED package of FIG. 9A, but for a single LED chip embodiment according to principles of the present disclosure.
Figure 10B:
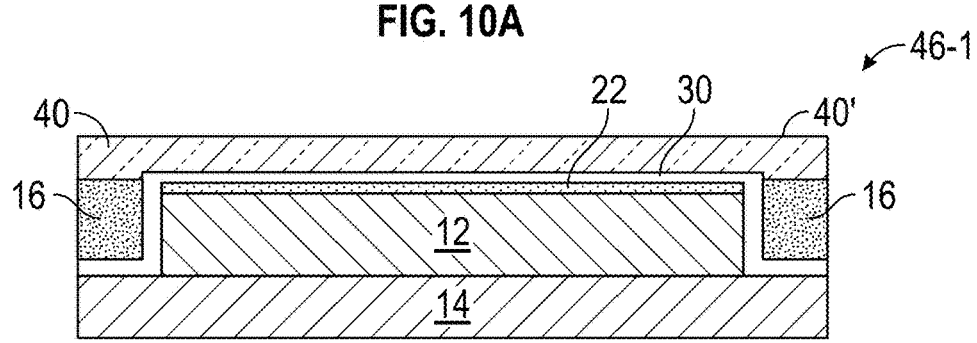
FIG. 10B is a cross-sectional view taken along the sectional line 10B-10B of FIG. 10A for an LED package that further includes an encapsulant with a planar upper surface.
Figure 10C:
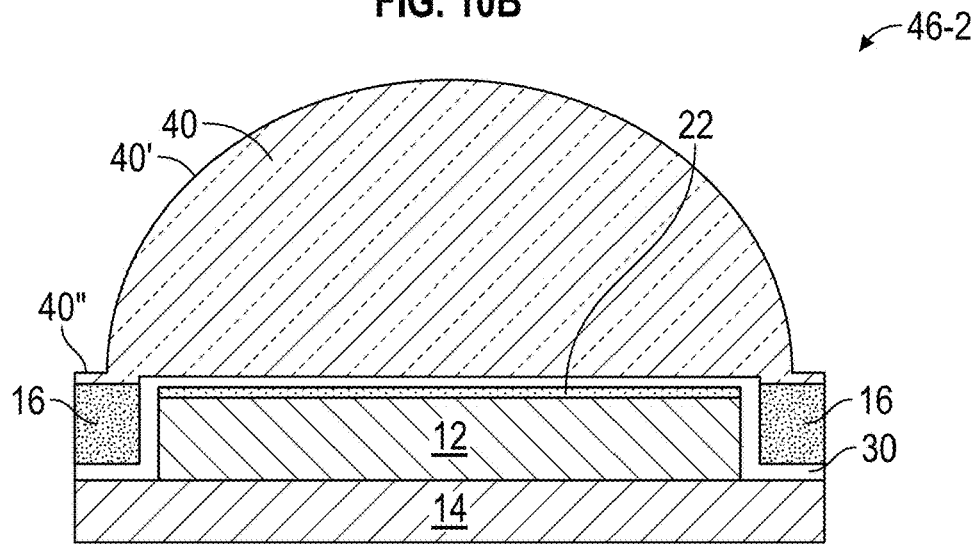
FIG. 10C is a cross-sectional view that is similar to the cross-sectional view of FIG. 10B for an LED package that further includes an encapsulant with a curved upper surface.

FIG. 10A is a top view of an exemplary LED package 46 that is similar to the LED package 44 of FIG. 9A, but for a single LED chip embodiment according to principles of the present disclosure. The LED chip 12 of the LED package 46 is registered at a center of the submount 14 and the lumiphoric material 22 is provided on the LED chip 12 and not on portions of the submount 14 that are adjacent to the LED chip 12. The lumiphoric material 22 may be formed at the chip level or as a pre-formed structure as described above for FIG. 9A. In the top view of FIG. 10A, the LED chips 12 is positioned underneath the lumiphoric material 22. FIGS. 10B and 10C illustrate cross-sectional views taken along the sectional line 10B-10B of FIG. 10A for LED packages 46-1, 46-2 that further include different configurations of the encapsulant 40. In FIG. 10B, the encapsulant 40 forms a flat lens that includes a planar upper surface 40' in a similar manner as described above for FIG. 7B. In FIG. 10C, the encapsulant 40 forms a lens with a dome shape having a curved upper surface 40' in a similar manner as described above for FIG. 7C.

Figure 11:
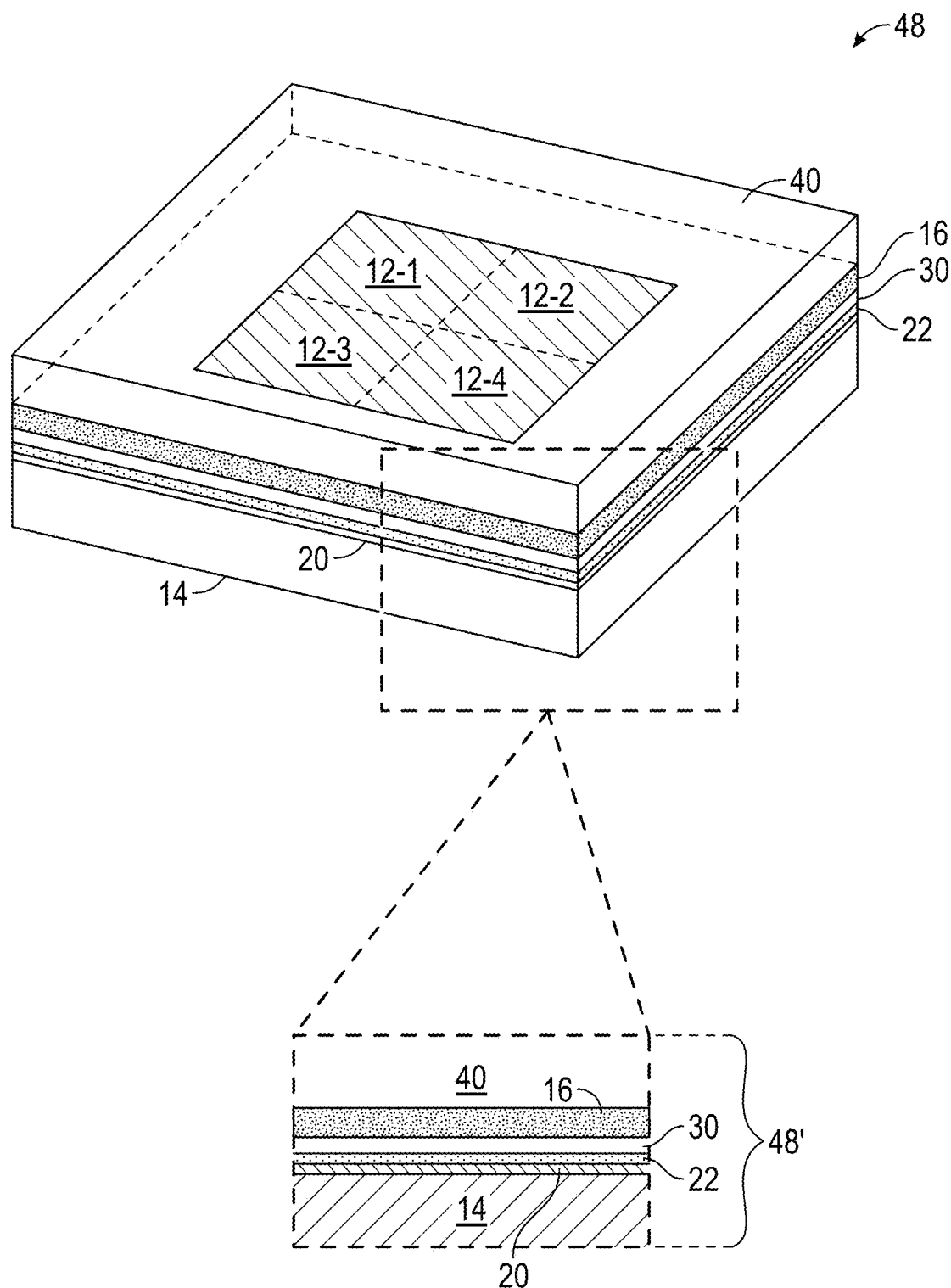
FIG. 11 is a top perspective view of an LED package that is similar to the LED package of FIGS. 7A and 7B and further includes an exploded view of a portion of a peripheral sidewall of the LED package.

FIG. 11 is a top perspective view of an LED package 48 that is similar to the LED package 38 of FIGS. 7A and 7B. Locations of the LED chips 12-1 to 12-4 within the LED package 48 are provided in an array registered with a center of the submount 14. The LED chips 12-1 to 12-4 are underneath the lumiphoric material 22 and the spacer layer 30 as previously described. The light-altering material 16 is provided to laterally surround the LED chips 12-1 to 12-4 to define a light-emitting surface for the LED package 48. FIG. 11 also illustrates an exploded portion of a peripheral sidewall 48' or peripheral edge of the LED package 48. As illustrated, the peripheral sidewall 48' may be formed by portions of the lumiphoric material 22, the spacer layer 30, and the light-altering material 16. By extending spacer layer 30 to the peripheral sidewall 48', unintended propagation of the light-altering material 16 may further be reduced along the peripheral sidewall 48'. In certain embodiments, the peripheral sidewall 48' may also be formed by one or more of the submount 14, the reflective layer 20, and the encapsulant 40.

While previously described embodiments include arrangements of spacer layers relative to lumiphoric materials, principles of the present disclosure are applicable to LED packages that are devoid of lumiphoric materials. In such embodiments, spacer layers may be employed on other surfaces or gaps between LED chips to reduce unintended propagation of light-altering materials.

Figure 12A:
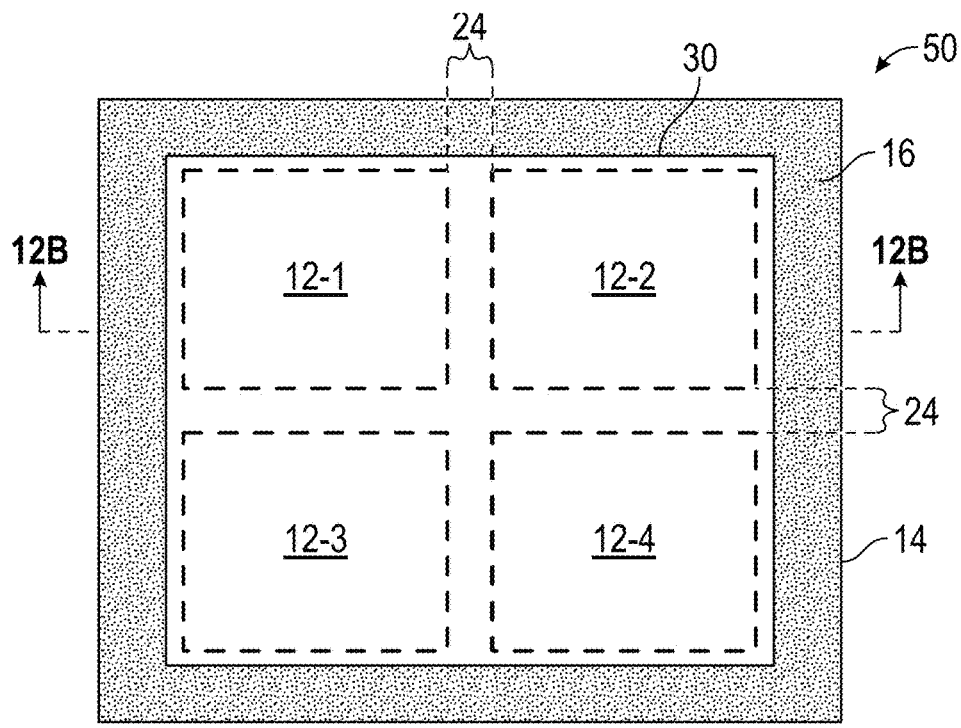
FIG. 12A is a top view of an exemplary LED package that is similar to the LED package of FIG. 7A, but for embodiments that do not include lumiphoric materials according to principles of the present disclosure.

FIG. 12A is a top view of an exemplary LED package 50 that is similar to the LED package 38 of FIG. 7A, but for embodiments that do not include lumiphoric materials. In such embodiments, the spacer layer 30 may be provided to cover surfaces of the LED chips 12-1 to 12-4 and corresponding gaps 24 that are between the LED chips 12-1 to 12-4. In the top view of FIG. 12A, the LED chips 12-1 to 12-4 are underneath the spacer layer 30 in locations indicated by superimposed dashed-line squares. In certain configurations, the LED chips 12-1 to 12-4 may include one or more rough surfaces that could promote unintended propagation of the light-altering material 16. By arranging the spacer layer 30 to cover the LED chips 12-1 to 12-4 and within the gaps 24, the light-altering material 16 may accordingly be formed with reduced unintended propagation.

Figure 12B:
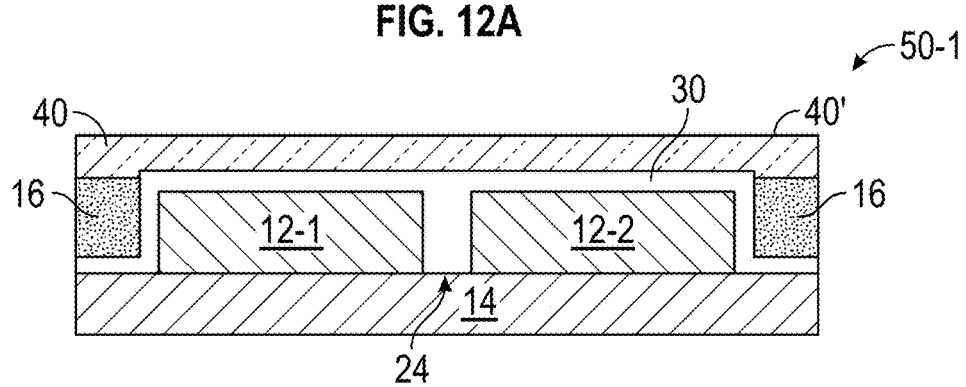
FIG. 12B is a cross-sectional view taken along the sectional line 12B-12B of FIG. 12A for an LED package that further includes an encapsulant with a planar upper surface.
Figure 12C:
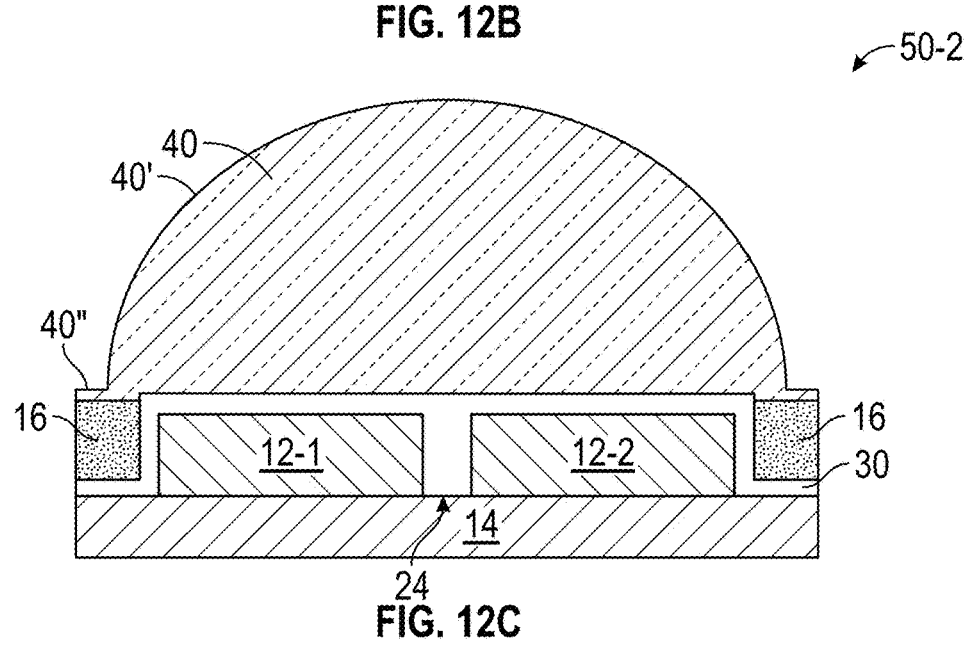
FIG. 12C is a cross-sectional view that is similar to the cross-sectional view of FIG. 12B for an LED package that further includes an encapsulant with a curved upper surface.

FIGS. 12B and 12C illustrate cross-sectional views taken along the sectional line 12B-12B of FIG. 12A for LED packages 50-1, 50-2 that further include different configurations of the encapsulant 40. In FIG. 12B, the encapsulant 40 forms a flat lens that includes a planar upper surface 40' in a similar manner as described above for FIG. 7B. In FIG. 12C, the encapsulant 40 forms a lens with a dome shape having a curved upper surface 40' in a similar manner as described above for FIG. 7C.

Figure 13A:
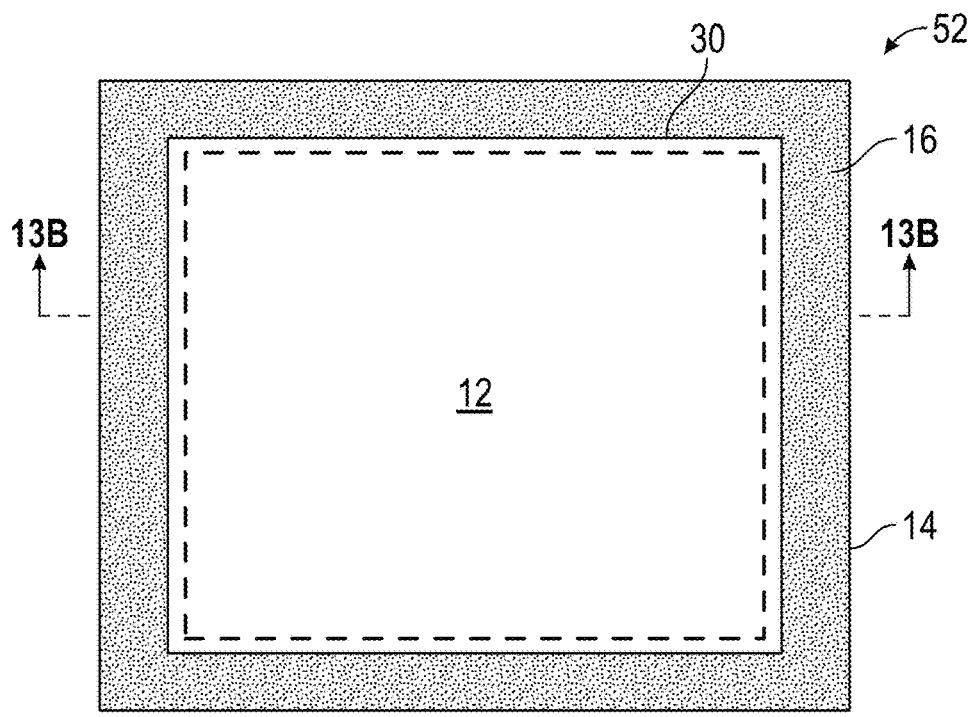
FIG. 13A is a top view of an exemplary LED package that is similar to the LED package of FIG. 12A, but for a single LED chip embodiment according to principles of the present disclosure.
Figure 13B:
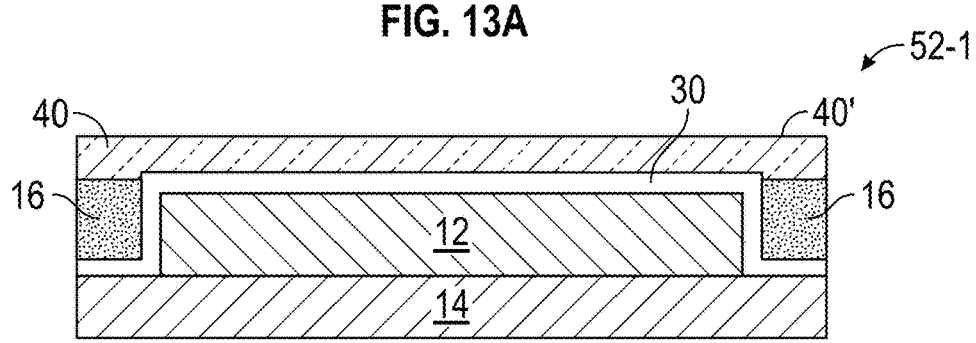
FIG. 13B is a cross-sectional view taken along the sectional line 13B-13B of FIG. 13A for an LED package that further includes an encapsulant with a planar upper surface.
Figure 13C:
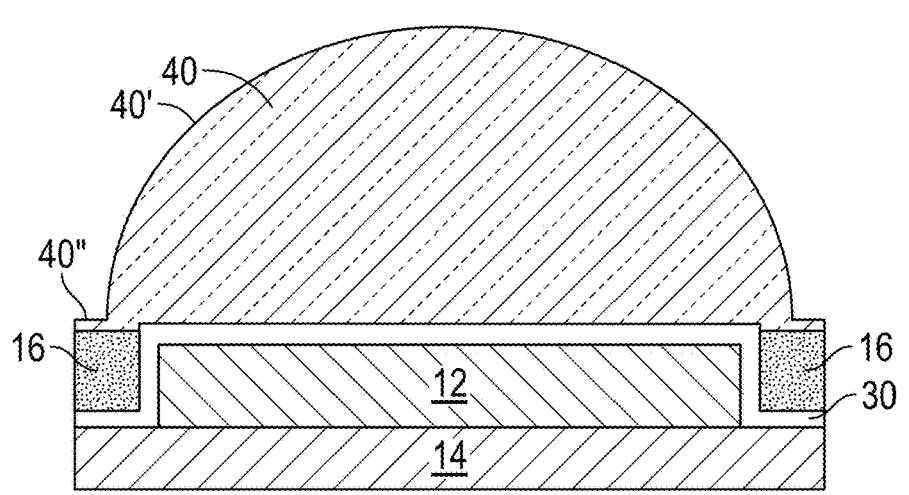
FIG. 13C is a cross-sectional view that is similar to the cross-sectional view of FIG. 13B for an LED package that further includes an encapsulant with a curved upper surface.

FIG. 13A is a top view of an exemplary LED package 52 that is similar to the LED package 50 of FIG. 12A, but for a single LED chip embodiment according to principles of the present disclosure. The LED chip 12 of the LED package 52 is registered at a center of the submount 14 and the spacer layer 30 is provided on the LED chip 12 and on portions of the submount 14 that are adjacent to the LED chip 12. In the top view of FIG. 13A, the LED chip 12 is positioned underneath the spacer layer 30 in a location indicated by a superimposed dashed-line square. FIGS. 13B and 13C illustrate cross-sectional views taken along the sectional line 13B-13B of FIG. 13A for LED packages 52-1, 52-2 that further include different configurations of the encapsulant 40. In FIG. 13B, the encapsulant 40 forms a flat lens that includes a planar upper surface 40' in a similar manner as described above for FIG. 7B. In FIG. 13C, the encapsulant 40 forms a lens having a dome shape with a curved upper surface 40' in a similar manner as described above for FIG. 7C.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. A light-emitting diode (LED) package comprising:
   a submount;
   at least one LED chip on the submount, wherein the at least one LED chip comprises a first face mounted to the submount and a second face that opposes the first face;
   a lumiphoric material on the second face;
   a light-altering material on the submount and arranged along a perimeter of the at least one LED chip;
   a spacer layer on the lumiphoric material, wherein the spacer layer extends between the light-altering material and the submount; and
   an encapsulant layer on the spacer layer and the light-altering material;
   wherein the at least one LED chip comprises a first LED chip and a second LED chip arranged on the submount to form a gap between the first LED chip and the second LED chip, and the spacer layer is in the gap.

2. The LED package of claim 1, wherein the lumiphoric material is between the spacer layer and the submount in the gap.

3. The LED package of claim 1, wherein the spacer layer is between the lumiphoric material and the submount in the gap.

4. The LED package of claim 1, wherein a thickness of the spacer layer as measured in a direction perpendicular to the submount is less than a thickness of the at least one LED chip as measured in a direction perpendicular to the submount.

5. The LED package of claim 4, wherein the thickness of the spacer layer is in a range from 1% to 50% of the thickness of the at least one LED chip.

6. The LED package of claim 1, wherein a thickness of the spacer layer as measured in a direction perpendicular to the submount is less than a thickness of the lumiphoric material as measured in a direction perpendicular to the submount.

7. The LED package of claim 1, wherein a portion of the lumiphoric material is between the light-altering material and the submount.

8. The LED package of claim 1, wherein the encapsulant layer is a lens on the spacer layer and the light-altering material.

9. The LED package of claim 8, wherein the lens comprises a planar top surface.

10. The LED package of claim 8, wherein the lens comprises a curved top surface.

11. The LED package of claim 1, wherein the spacer layer comprises silicone.

12. The LED package of claim 1, wherein the light-altering material comprises one or more of light-reflecting particles, light-absorbing particles, and light-refracting particles.

13. The LED package of claim 1, wherein a lateral distance between the light-altering material and the at least one LED chip is less than 100 microns.

14. A light-emitting diode (LED) package comprising:
at least one LED chip;
a lumiphoric material on the at least one LED chip;
a light-altering material arranged along a perimeter of the at least one LED chip;
a spacer layer on the lumiphoric material;
a reflective layer on the submount, wherein the reflective layer is between the lumiphoric material and the submount; and
an encapsulant layer on the spacer layer and the light-altering material;
wherein a peripheral sidewall of the LED package is formed by portions of the lumiphoric material, the spacer layer, the light-altering material, the reflective layer, and the encapsulant layer.

15. The LED package of claim 14, wherein the spacer layer is between the light-altering material and the lumiphoric material at the peripheral sidewall of the LED package.

16. The LED package of claim 14, further comprising a submount that supports the at least one LED chip, wherein the peripheral sidewall of the LED package is formed by portions of the lumiphoric material, the spacer layer, the light-altering material, the reflective layer, the encapsulant layer, and the submount.

17. A light-emitting diode (LED) package comprising:
a submount;
at least one LED chip on the submount, wherein the at least one LED chip comprises a first face mounted to the submount and a second face that opposes the first face;
a light-altering material on the submount and arranged along a perimeter of the at least one LED chip;
a spacer layer on the at least one LED chip and on a portion of the submount that is adjacent to the at least one LED chip, wherein the spacer layer extends between the light-altering material and the submount; and
an encapsulant layer on the spacer layer and the light-altering material
wherein the at least one LED chip comprises a first LED chip and a second LED chip arranged on the submount to form a gap between the first LED chip and the second LED chip, and the spacer layer is in the gap.

18. The LED package of claim 17, wherein a thickness of the spacer layer as measured in a direction perpendicular to the submount is less than a thickness of the at least one LED chip as measured in a direction perpendicular to the submount.

19. The LED package of claim 18, wherein the thickness of the spacer layer is in a range from 1% to 50% of the thickness of the at least one LED chip.

20. The LED package of claim 17, wherein the encapsulant layer forms a lens on the spacer layer and the light-altering material.

21. The LED package of claim 17, wherein the light-altering material comprises one or more of light-reflecting particles, light-absorbing particles, and light-refracting particles.

22. The LED package of claim 17, wherein a lateral distance between the light-altering material and the at least one LED chip is less than 100 microns.

\* \* \* \* \*